(12) United States Patent
Bourgeois et al.

(10) Patent No.: US 12,336,321 B2
(45) Date of Patent: Jun. 17, 2025

(54) PHOTOVOLTAIC DEVICES WITH TEXTURED TCO LAYERS, AND METHODS OF MAKING TCO STACKS

(71) Applicant: First Solar, Inc., Tempe, AZ (US)

(72) Inventors: Paulina Bourgeois, Perrysburg, OH (US); Robert Clark-Phelps, Perrysburg, OH (US); Qi Fang, Perrysburg, OH (US); Jing Guo, Sunnyvale, CA (US); Gopal Mor, Perrysburg, OH (US); Rui Shao, Sylvania, OH (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 17/279,254

(22) PCT Filed: Sep. 23, 2019

(86) PCT No.: PCT/US2019/052370
§ 371 (c)(1),
(2) Date: Mar. 24, 2021

(87) PCT Pub. No.: WO2020/068630
PCT Pub. Date: Apr. 2, 2020

(65) Prior Publication Data
US 2022/0013674 A1      Jan. 13, 2022

Related U.S. Application Data

(60) Provisional application No. 62/735,328, filed on Sep. 24, 2018.

(51) Int. Cl.
*H10F 77/20* (2025.01)
*C03C 17/34* (2006.01)
(Continued)

(52) U.S. Cl.
CPC ....... *H10F 77/247* (2025.01); *C03C 17/3417* (2013.01); *C23C 14/34* (2013.01);
(Continued)

(58) Field of Classification Search
CPC ..... H01L 31/022466; H01L 31/022475; H01L 31/022483; H01L 31/1884;
(Continued)

(56) References Cited

U.S. PATENT DOCUMENTS

2003/0035906 A1* 2/2003 Memarian ....... H01L 31/022475
427/126.3
2007/0029186 A1* 2/2007 Krasnov ............. C03C 17/3423
204/192.29
(Continued)

FOREIGN PATENT DOCUMENTS

EP         2523227 A1   11/2012
JP      2006249554 A    9/2006
(Continued)

OTHER PUBLICATIONS

"Optical Constants of CdS (Cadmium Sulfide)", accessed from https://refractiveindex.info/?shelf=main&book=CdS&page=Bieniewski-o, accessed on Mar. 29, 2023.*
(Continued)

*Primary Examiner* — Golam Mowla
(74) *Attorney, Agent, or Firm* — MacMillan, Sobanski & Todd, LLC

(57) ABSTRACT

According to the embodiments provided herein, a method for sputtering a TCO material onto a substrate includes process conditions that produce a textured topography at the interfaces of various layers. The textured topography can include an average roughness from about 5 to about 40 nm. The process conditions can include providing oxygen in the sputtering environment at a flow rate of from 0 to about 30
(Continued)

sccm; or heating the substrate to at least 200; or increasing the magnetic field strength to above 40 mT. The textured topography creates interfacial transition areas which have hybrid physical properties compared to their constituent materials.

17 Claims, 12 Drawing Sheets

(51) Int. Cl.
C23C 14/34 (2006.01)
H10F 71/00 (2025.01)
H10F 77/42 (2025.01)
C23C 14/08 (2006.01)

(52) U.S. Cl.
CPC ......... H10F 71/138 (2025.01); H10F 77/484 (2025.01); C03C 2217/232 (2013.01); C03C 2217/948 (2013.01); C03C 2218/154 (2013.01); C23C 14/086 (2013.01)

(58) Field of Classification Search
CPC .......... C03C 17/3417; C03C 2217/232; C03C 2217/948; C03C 2218/154; C23C 14/34; C23C 14/086; H10F 77/247; H10F 77/484; H10F 71/138
See application file for complete search history.

(56) References Cited

U.S. PATENT DOCUMENTS

| 2008/0096376 | A1 | 4/2008 | Li et al. |
| 2008/0153280 | A1 | 6/2008 | Li et al. |
| 2008/0210303 | A1* | 9/2008 | Lu ..................... H01L 31/02168 136/265 |
| 2008/0308411 | A1* | 12/2008 | Guo .................. H01L 31/02366 204/192.15 |
| 2009/0084438 | A1 | 4/2009 | den Boer et al. |
| 2009/0126791 | A1* | 5/2009 | Lu ......................... H01L 31/048 136/258 |
| 2009/0194155 | A1 | 8/2009 | den Boer et al. |
| 2011/0126875 | A1 | 6/2011 | Le et al. |
| 2011/0174361 | A1 | 7/2011 | Bang et al. |
| 2012/0153341 | A1 | 6/2012 | Vasko et al. |

FOREIGN PATENT DOCUMENTS

| JP | 2008153714 A | * | 7/2008 | ........... C23C 16/405 |
| JP | 2010080358 A | | 4/2010 | |
| JP | 2010514920 A | | 5/2010 | |
| JP | 2011183567 A | | 9/2011 | |
| JP | 2012504306 A | | 2/2012 | |
| JP | 201249218 A | | 3/2012 | |
| JP | 201358638 A | | 3/2013 | |
| JP | 2014010211 A | | 1/2014 | |
| JP | 2016127179 A | | 7/2016 | |
| JP | 2016183402 A | | 10/2016 | |
| TW | 201435107 A | * | 9/2014 | ........... C23C 14/086 |

OTHER PUBLICATIONS

TW 201435107 A machine translaiton as provided by FIT database, translated on Mar. 29, 2023.*
International Search Report and Written Opinion, Application No. PCT/US2019/052370, dated Dec. 12, 2019.
European Examination Report, dated Feb. 14, 2022, Application No. 19 782 876.7.
Intellectual Property India Examination Report, dated Mar. 31, 2022, Application No. 202117011959.
Japanese Notification of Reasons for Rejection, Application No. 2021-516602, dated Dec. 20, 2022.
Japanese Notification of Reason(s) for Rejection, dated Aug. 23, 2023, Application No. 2021-516602.
European Patent Office, Communication pursuant to Article 94(3) EPC, dated Jun. 25, 2024, Application 19782876.7.
Malaysian Substantive Examination Adverse Report, dated Aug. 22, 2024, Application PI2021001559.

* cited by examiner

PHOTOVOLTAIC DEVICES WITH TEXTURED TCO LAYERS, AND METHODS OF MAKING TCO STACKS

CROSS-REFERENCE TO RELATED APPLICATIONS

This is a national phase application of international application PCT/US2019/052370, filed Sep. 23, 2019, and claims the benefit of U.S. Application 62/735,328, filed under 35 U.S.C. § 111 (b) on Sep. 24, 2018; each of which is incorporated by reference in the entirety.

BACKGROUND

The present specification generally relates to photovoltaic devices. A photovoltaic device generates electrical power by converting light into electricity using semiconductor materials that exhibit the photovoltaic effect to generate current that is collected by conductive contacts.

One concern with the efficiency of photovoltaic devices is the energy loss due to light that is reflected away from the device instead of being absorbed and converted to electrical current. Light reflection may occur at the glass substrate, where incident light first strikes the photovoltaic device, or at layer interfaces within the transparent conductive oxide (TCO) stack itself. Anti-reflection coatings and features have thus been employed on the energy side (light incident side) of the photovoltaic device in an attempt to address this loss. However, a need still exists for alternative TCO layer stacks and better methods of making them that reduce the energy loss due to reflected light.

SUMMARY

Some embodiments provided herein relate to sputtering a transparent conductive oxide (TCO) material, such as a TCO material deposited on a glass substrate. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. Figures are not necessarily to scale such that the thickness of lines and layers may be exaggerated for clarity. The following detailed description of the illustrative embodiments can be understood when read in conjunction with the following drawings, where like structure is indicated with like reference numerals and in which:

DETAILED DESCRIPTION

Embodiments of methods of depositing a TCO material on a substrate, such as sputtering a TCO material on a glass substrate, used in a process for forming a photovoltaic device are described herein. Various embodiments of the photovoltaic device, methods of sputtering a TCO material, and methods for forming the photovoltaic device will be described in more detail herein.

Figure 1:
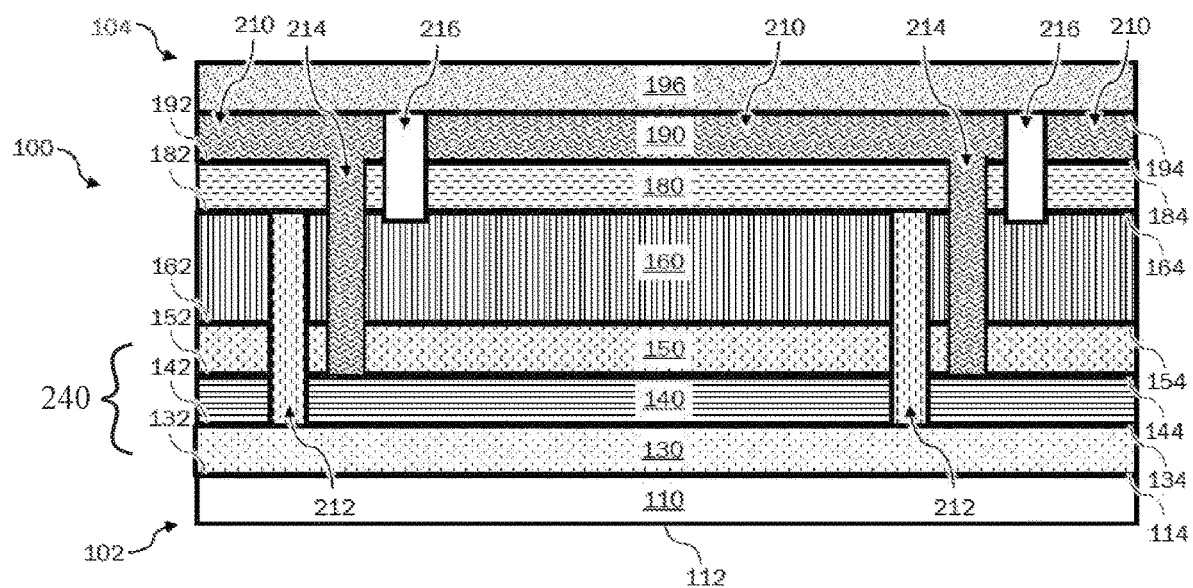
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 100 can also define an opposing side 104 offset from the energy side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. The photovoltaic device 100 can include a plurality of layers disposed between the energy side 102 and the opposing side 104. As used herein, the term "layer" refers to a thickness of material provided upon a surface. Each layer can cover all or any portion of the surface.

Figure 2:
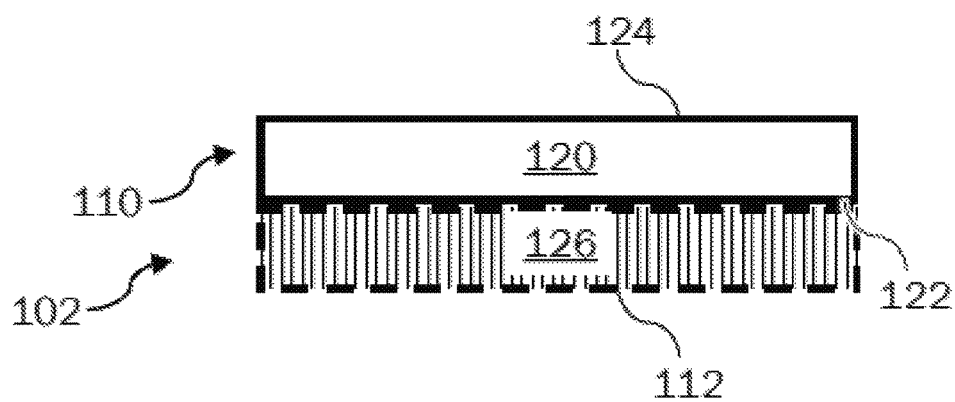
FIG. 2 schematically depicts a substrate according to one or more embodiments shown and described herein.

The photovoltaic device 100 can include a substrate 110 configured to facilitate the transmission of light into the photovoltaic device 100. The substrate 110 can be disposed at the energy side 102 of the photovoltaic device 100. Referring collectively to FIGS. 1 and 2, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 1,300 nm in some embodiments, or about 250 nm to about 950 nm in other embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance, or more. Optionally, the substrate 110 can include a coating 126 applied to the first surface 122 of the transparent layer 120. The coating 126 can be configured to interact with light or to improve durability of the substrate 110 such as, but not limited to, an antireflective coating, an anti-soiling coating, or a combination thereof.

Referring again to FIG. 1, the photovoltaic device 100 can include an optional barrier layer 130 configured to mitigate diffusion of contaminants (e.g., sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 500 Å in one embodiment, more than about 750 Å in another embodiment, or less than about 1200 Å in a further embodiment.

Referring still to FIG. 1, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F:SnO$_2$), indium tin oxide (ITO), or cadmium stannate (Cd$_2$SnO$_4$, or CTO). In some embodiments, the TCO layer stack 140 comprises multiple layers with varying refractive indices, as is described in more detail later.

The photovoltaic device 100 can include a buffer layer 150 configured to provide an insulating layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer stack 140. For example, the first surface 152 of the buffer layer 150 can be provided upon the second surface 144 of the TCO layer 140. The buffer layer 150 may include material having higher resistivity than the TCO layer 140, including, but not limited to, tin dioxide, zinc magnesium oxide (e.g., Zn$_{1-x}$Mg$_x$O), silicon dioxide (SnO$_2$), aluminum oxide (Al$_2$O$_3$), aluminum nitride (AlN), zinc tin oxide, zinc oxide, tin silicon oxide, or any combination thereof. In some embodiments, the material of the buffer layer 150 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment. According to the embodiments, provided herein, a TCO layer stack 240 can include the barrier layer 130, the TCO layer 140, the buffer layer 150, or any combination thereof.

Referring again to FIG. 1, the photovoltaic device 100 can include an absorber layer 160 configured to cooperate with another layer to form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 2 μm to about 5 μm in another embodiment.

According to the embodiments described herein, the absorber layer 160 can be formed from a p-type semiconductor material having an excess of positive charge carriers, i.e., holes. The absorber layer 160 can include any suitable p-type semiconductor material such as group II-VI semiconductors. Specific examples include, but are not limited to, semiconductor materials comprising cadmium, tellurium, selenium, or any combination thereof. Suitable examples include, but are not limited to, binary or ternary combinations of cadmium, selenium, and tellurium (e.g., CdSe$_x$Te$_{1-x}$ where x may range from 0 to 1), or a compound comprising cadmium, selenium, tellurium, and one or more additional element.

In embodiments where the absorber layer 160 comprises tellurium and cadmium, the atomic percent of the tellurium can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. It is noted that the atomic percent described herein is representative of the entirety of the absorber layer 160, the atomic percentage of material at a particular location within the absorber layer 160 can vary with thickness compared to the overall composition of the absorber layer 160.

In embodiments where the absorber layer 160 comprises selenium and tellurium, the atomic percent of the selenium in the absorber layer 160 can be greater than about 0 atomic percent and less or equal to than about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can vary through the thickness of the absorber layer 160. For example, when the absorber layer 160 comprises a compound including selenium at a mole fraction of x (x being between 0.05 and 0.95) and tellurium at a mole fraction of 1-x ($Se_xTe_{1-x}$), x can vary in the absorber layer 160 with distance from the first surface 162 of the absorber layer 160.

According to the embodiments provided herein, the absorber layer 160 can be doped with a dopant configured to manipulate the charge carrier concentration. In some embodiments, the absorber layer can be doped with a group I or V dopant such as, for example, copper, silver, arsenic, phosphorous, antimony, or a combination thereof. The total dosage of the dopant within the absorber layer 160 can be controlled. Alternatively or additionally, the amount of the dopant can vary with distance from the first surface 162 of the absorber layer 160.

Referring still to FIG. 1, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material, such as the TCO layer stack 140. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Figure 3:
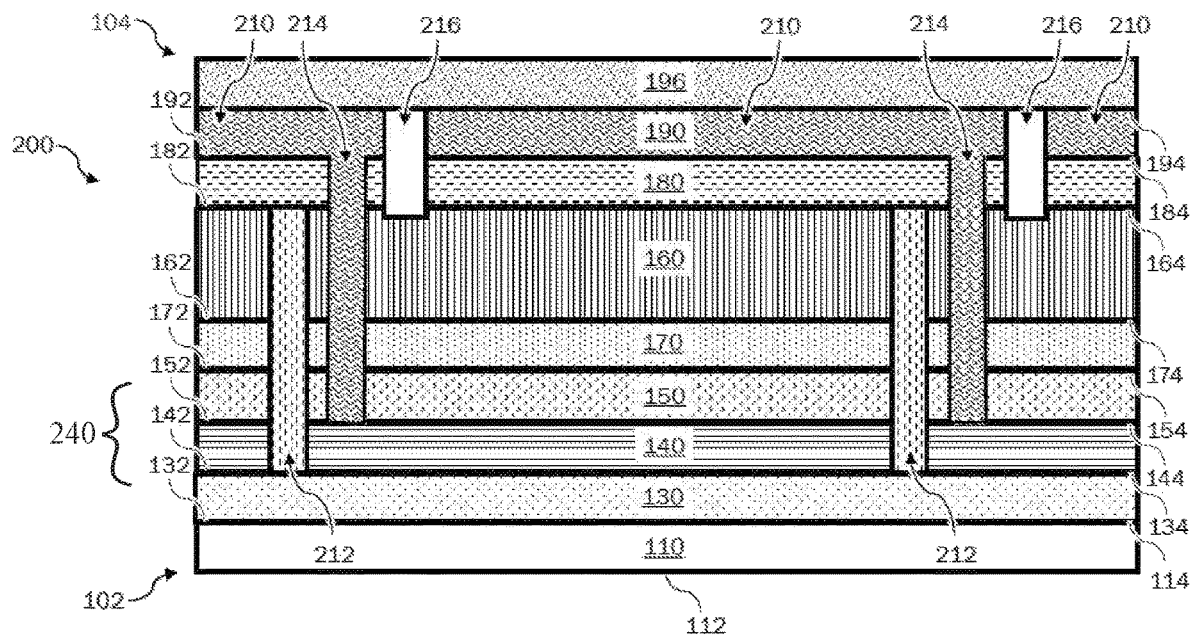
FIG. 3 schematically depicts a photovoltaic device according to one or more embodiments shown and described herein.

Referring now to FIG. 3, in some embodiments, a photovoltaic device 200 can include a window layer 170 comprising n-type semiconductor material. The absorber layer 160 can be formed adjacent to the window layer 170. The window layer 170 can have a first surface 172 substantially facing the energy side 102 of the photovoltaic device 100 and a second surface 174 substantially facing the opposing side 104 of the photovoltaic device 100. In some embodiments, the window layer 170 can be positioned between the absorber layer 160 and the TCO layer 20. In one embodiment, the window layer 170 can be positioned between the absorber layer 160 and the buffer layer 150. The window layer 170 can include any suitable material, including, for example, cadmium sulfide, zinc sulfide, cadmium zinc sulfide, zinc magnesium oxide, or any combination thereof.

Referring collectively to FIGS. 1 and 3, the photovoltaic device 100 can include a back contact layer 180 configured to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can be formed as a multi-layer configuration and comprise binary or ternary combinations of materials from groups I, II, VI, such as for example, one or more layers containing zinc, copper, cadmium, and tellurium in various compositions. Further exemplary materials include, but are not limited to, zinc telluride doped with copper telluride, or zinc telluride alloyed with copper telluride.

The photovoltaic device 100 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include aluminum nitride, nickel nitride, titanium nitride, tungsten nitride, selenium nitride, tantalum nitride, or vanadium nitride. In certain embodiments the conducting layer can comprise three or more layers where the first layer is a nitride or oxynitride, e.g., $MoN_x$, $TiN_x$, $CrN_x$, $WN_x$ or $MoO_xN_y$, etc, the second layer is a conducting layer such as Al or an alloy of Al, and the third layer is a protective layer, e.g., Cr.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to conducting layer 190. The back support 196 can include any suitable material, including, for example, glass (e.g., soda-lime glass).

Referring still to FIGS. 1 and 3, manufacturing of a photovoltaic device 100, 200 generally includes sequentially disposing functional layers or layer precursors in a "stack" of layers through one or more processes, including, but not limited to, sputtering, spray, evaporation, molecular beam deposition, pyrolysis, closed space sublimation (CSS), pulse laser deposition (PLD), chemical vapor deposition (CVD), plasma enhanced chemical vapor deposition (PECVD), electrochemical deposition (ECD), atomic layer deposition (ALD), or vapor transport deposition (VTD).

Manufacturing of a photovoltaic device 100, 200 can further include the selective removal of the certain layers of the stack of layers, i.e., scribing, to divide the photovoltaic device into 100, 200 a plurality of cells 210. For example, a first isolation scribe 212 (also referred to as P1 scribe) can be formed to ensure that the TCO layer stack 140 is electrically isolated between cells 210. Specifically, the first isolation scribe 212 can be formed though the TCO layer stack 140, the buffer layer 150, and the absorber layer 160 of photovoltaic device 100, or though the TCO layer stack 140, the buffer layer 150, the window layer 170, and the absorber layer 160 of photovoltaic device 200. Accordingly, the first isolation scribe 212 can be formed after the absorber layer 160 is deposited. The first isolation scribe 212 can then be filled with dielectric material before deposition of the back contact layer 180 and the conducting layer 190.

A series connecting scribe 214 (also referred to as P2 scribe) can be formed to electrically connect cells 210 in series. For example, the series connecting scribe 214 can be utilized to provide a conductive path from the conductive layer 190 of one cell 210 to the TCO layer stack 140 of another cell 210. The series connecting scribe 214 can be formed through the absorber layer 160, and the back contact layer 180 of photovoltaic device 100, or through the window layer 170, the absorber layer 160, and the back contact layer 180 of photovoltaic device 200. Optionally, the series connecting scribe 214 can be formed through some or all of the buffer layer 150. Accordingly, the series connecting scribe 214 can be formed after the back contact layer 180 is deposited. The series connecting scribe 214 can then be filled with a conducting material such as, but not limited to, the material of the conducting layer 190.

A second isolation scribe 216 (also referred to as P3 scribe) can be formed to isolate the back contact 190 into individual cells 210. The second isolation scribe 216 can be formed to isolate the conductive layer 190, the back contact layer 180, and at least a portion of the absorber layer 160. According to the embodiments provided herein, each of the first isolation scribe 212, the series connecting scribe 214, and the second isolation scribe 216 can be formed via laser cutting or laser scribing.

Figure 4:
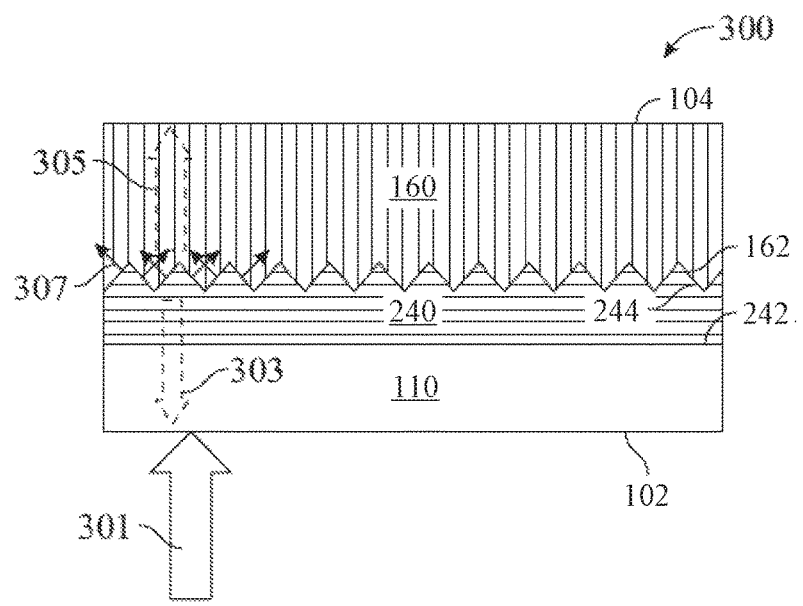
FIG. 4 depicts a textured topography according to one or more embodiments shown and described herein.

Referring now to FIG. 4, a modified photovoltaic device 300 is depicted. The photovoltaic device 300 includes a substrate 110, on which is sputtered at least a TCO layer stack 240. An absorber layer 160 is deposited by any suitable method on the TCO layer stack 240. The TCO layer stack 240 can have a first surface 242 substantially facing the energy side 102 of the photovoltaic device 300 and a second surface 244 substantially facing the opposing side 104 of the photovoltaic device 300. In this embodiment however, the second surface 244 of the TCO layer stack 240—which lies adjacent the first surface 162 of the absorber layer 160—exhibits a textured topography at this interface. The convention of designating this interface using the numerals of the two surfaces that form it, separated by a forward slash, is adopted herein (e.g. interface 244/162 for the interface mentioned immediately above). The textured topography can be thought of as a plurality of hills and valleys of varying height and diameter. As incident light 301 enters the photovoltaic device 300 from the energy side 102, the light 301 is still partially reflected. However, it is noted that the reflected portion 303 of the light 301 is reduced by the textured topography compared to the reflection of a smooth interface. Accordingly, the textured topography can increase light 305 that is transmitted into the absorber layer 160 as light 307 scatters at the textured interface 244/162. The increase in light 305 transmitted into the absorber layer 160 produces increased current in the photovoltaic device 300.

Although the textured topography is shown at the TCO layer stack/absorber interface (244/162) in the photovoltaic device 300 of FIG. 4, the textured topography can be positioned at any other interface within a photovoltaic device 300 up to and including the absorber layer 160. Consider, for example, the photovoltaic device 200 of FIG. 3. Any or all of the following interfaces of the TCO layer stack 240 could contain a textured topography in accordance with differing embodiments of the disclosure: substrate/barrier layer (114/132), barrier layer/TCO layer (134/142), or TCO layer/buffer layer (144/152). In embodiments, having a window layer 170, the buffer layer/window layer (154/172), or window layer/absorber (174/162) can also be textured. Furthermore, even the TCO layer stack 240 can comprise multiple layers, each having their own internal interfaces that can be textured. Under a given set of sputtering conditions, once a textured topography is begun, subsequent layers may adopt a similar texture. However, by selecting varying sputtering conditions, is may be possible to accentuate hills or smooth them, as desired.

As used herein "average roughness" is the measure of the magnitude of the texturing of a surface or interface. It should be understood that the process of sputtering can produce a distribution of hills and valleys, some higher, others lower; some wider, others narrower. Providing a textured topography as described herein may either accentuate or diminish such distribution. The "average roughness" estimates the mean height of the hills from the valley floor. Two methods are known for assessing average roughness. The first method is atomic force microscopy (AFM) which makes a 3-D image of the surface, and calculates an average roughness. The second method is ellipsometry which shines polarized light onto the surface and detects the reflected light and compares this to known models to estimate average roughness.

Figure 5:
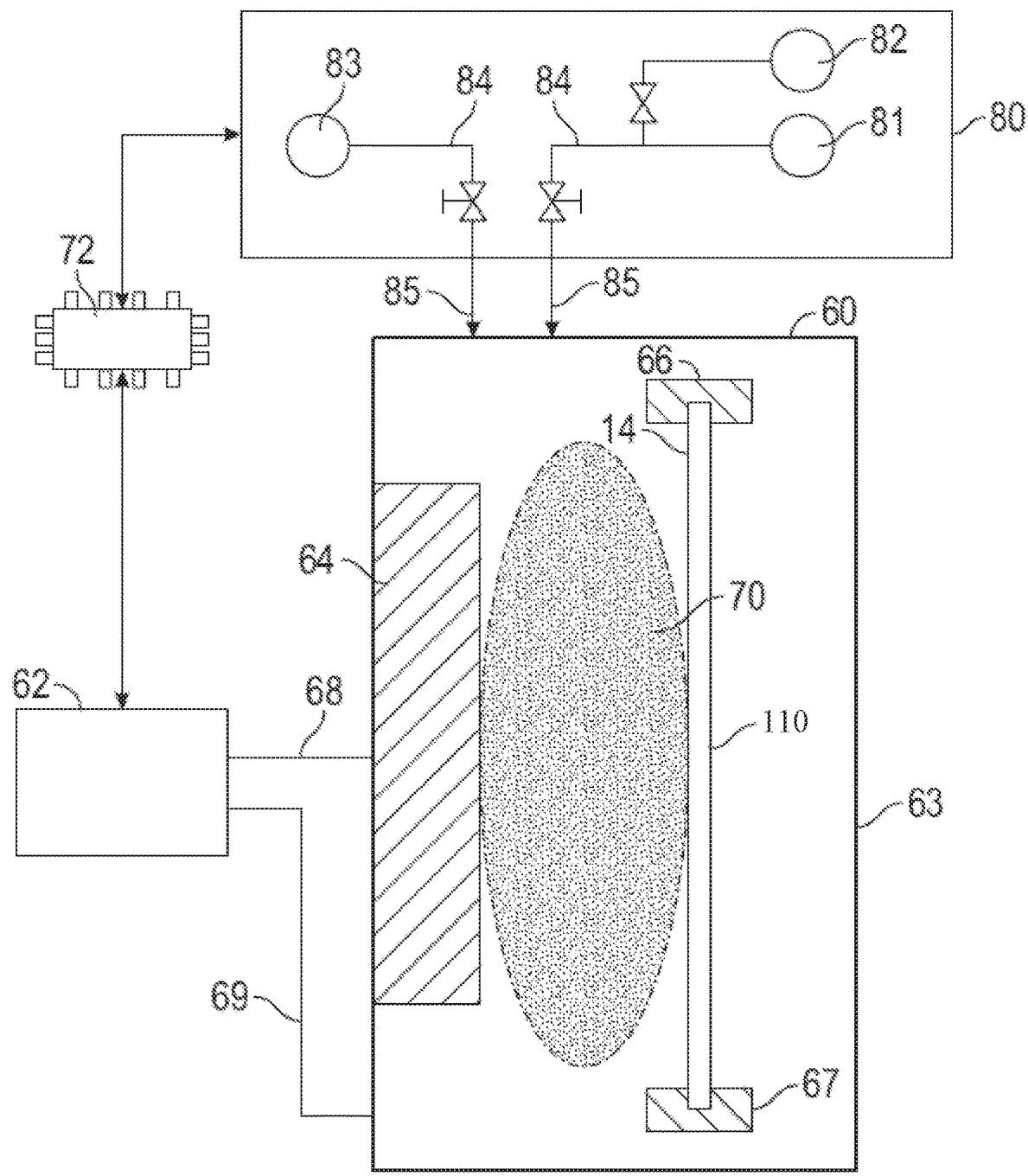
FIG. 5 schematically depicts in cross section an exemplary sputtering chamber according to one or more embodiments shown and described herein.

Referring now to FIG. 5, a general schematic is shown in cross-section of an exemplary sputtering chamber 60 according to one embodiment of the present invention. The exemplary sputtering chamber 60 is shown having a vertical orientation, although any other configuration can be utilized. The chamber 60 itself forms the anode 63; and the cathode 64 is formed in one wall of the chamber facing the substrate 110. The substrate 110 can held between first support 66 and second support 67, as shown, or alternatively, the substrate 110 can be supported on rollers or a conveyor in a horizontal orientation. Generally, the substrate 110 is positioned within the sputtering chamber 60 such that a sputtered layer 14 is formed on the surface facing the cathode 64. A power source 62 is configured to control and supply power to the chamber 60. Depending on the specific material to be sputtered or the specific substrate on which it is to be sputtered, the power may be supplied as either DV voltage or RF (alternating) voltage. As shown, via wires 68 and 69, respectively, the power source 62 applies a voltage to the cathode 64 to create a voltage potential between the cathode 64 and an anode 65 such that the substrate 110 is between the cathode 64 and anode 65. Although only a single power source 62 is shown, the voltage potential can be realized through the use of multiple power sources coupled together.

A sputtering environment control system 80 is depicted for introducing ionizable gases into the sputter chamber 60. Environment control system 80 includes a source of inert gas 81, and one or more sources of reactive gases 82, 83, and control valves for modulating the amount of gas released. The gas sources 81-83 are connected to the sputtering chamber 60 via one or more feed lines 84 and one or more inlets 85. In various embodiments, the source of inert gas 81 can be argon or nitrogen; and the source of reactive gas 82, 83, can include, for example, hydrogen, oxygen, $H_2O$, a mixture of Ar and $O_2$, a mixture of Ar and $H_2$, a mixture of $N_2$ and $O_2$, and a mixture of $N_2$ and $H_2$. When hydrogen is among the reactive gases, it is preferable to mix it in low percentages with the inert gas as shown at 82. Oxygen may have a dedicated inlet to the sputtering chamber 60. The environment control system 80 can be communicatively coupled to one or more processors 72, which is generally depicted in FIG. 4 as double-arrowed lines. As used herein, the term "communicatively coupled" means that the components are capable of exchanging data signals with one another such as, for example, electrical signals via conductive medium, electromagnetic signals via air, optical signals via optical waveguides, and the like.

A plasma field 70 is created once the sputtering atmosphere is ignited, and is sustained in response to the voltage potential between the cathode 64 and the chamber wall acting as an anode 63. The voltage potential causes the plasma ions within the plasma field 70 to accelerate toward the cathode 64, causing atoms from the cathode 64 to be ejected toward the surface on the substrate 110. As such, the cathode 64 is also referred to as a "target" and acts as the source material for the formation of the sputtered layer 14 on the surface facing the cathode 64. The nature of the cathode 64 is dependent on the layer or layers to be sputtered. It can be a metal or alloy target, such as elemental tin, elemental zinc, or mixtures thereof; or a ceramic target. Additionally, in some embodiments, a plurality of cathodes 64 can be utilized. A plurality of cathodes 64 can be particularly useful to form a layer including several types of materials (e.g., co-sputtering). Since the sputtering atmosphere contains typically contains oxygen gas, oxygen particles of the plasma field 70 can react with the ejected target atoms to form an oxide layer on the sputtered layer 14 on the substrate 110.

For a non-limiting example, the TCO layer stack 240, or any layers thereof, can be formed via sputtering at the specified sputtering temperature from a metal target to form a TCO layer stack 240 on the substrate 110 in an atmosphere containing an inert gas (e.g., argon) and oxygen (e.g., about 0% to about 20% by volume oxygen). Any of the compositions and materials previously discussed as constituents of the layers of the TCO layer stack 240 such as, for example, barrier layers 130 and buffer layers 150 can be deposited by such a sputtering process.

According to the embodiments described herein, a processor 72 means any device capable of executing machine readable instructions. Accordingly, each of the one or more processors 72 may be a controller, an integrated circuit, a microchip, a computer, or any other computing device. The one or more processors 72 can be configured to execute logic or software and perform functions as discussed in more detail below. For example, in some embodiments, the processor 72 can be programmed to control the sputtering environment by controlling valves and regulating flow rates for the inert carrier, and any reactive gases, such as hydrogen or oxygen. In some embodiments, the processor 72 can be programmed to heat or cool the substrate to a desired temperature, or to increase or decrease the voltage to alter the magnetic field strength. Additionally, the one or more processors 72 can be communicatively coupled to one or more memory components that can store the logic and/or input received by the one or more processors 72. The memory components described herein may be RAM, ROM, a flash memory, a hard drive, or any device capable of storing machine readable instructions.

Embodiments of the present disclosure comprise logic that includes machine readable instructions or an algorithm written in any programming language of any generation (e.g., 1GL, 2GL, 3GL, 4GL, or 5GL) such as, e.g., machine language that may be directly executed by the processor, or assembly language, object-oriented programming (OOP), scripting languages, microcode, etc., that may be compiled or assembled into machine readable instructions and stored on a machine readable medium. Alternatively, the logic or algorithm may be written in a hardware description language (HDL), such as logic implemented via either a field-programmable gate array (FPGA) configuration or an application-specific integrated circuit (ASIC), and their equivalents. Accordingly, the logic may be implemented in any conventional computer programming language, as pre-programmed hardware elements, or as a combination of hardware and software components.

For some TCO stack layer 140 materials, an annealing step is beneficial. Annealing by heat energy or by laser energy is common in the industry of photovoltaic devices and need not be described in detail herein.

It has been observed that photovoltaic devices 100, 200, 300 having TCO layer stack 240 with certain desired roughness attributes create more internal reflection than smooth films generally deposited by a sputtering processes. However, by carefully controlling the sputtering conditions and sputtering environment, it has been found that layers of the TCO layer stack 240 that have improved internal reflection can be produced by a sputtering process.

Figure 6:
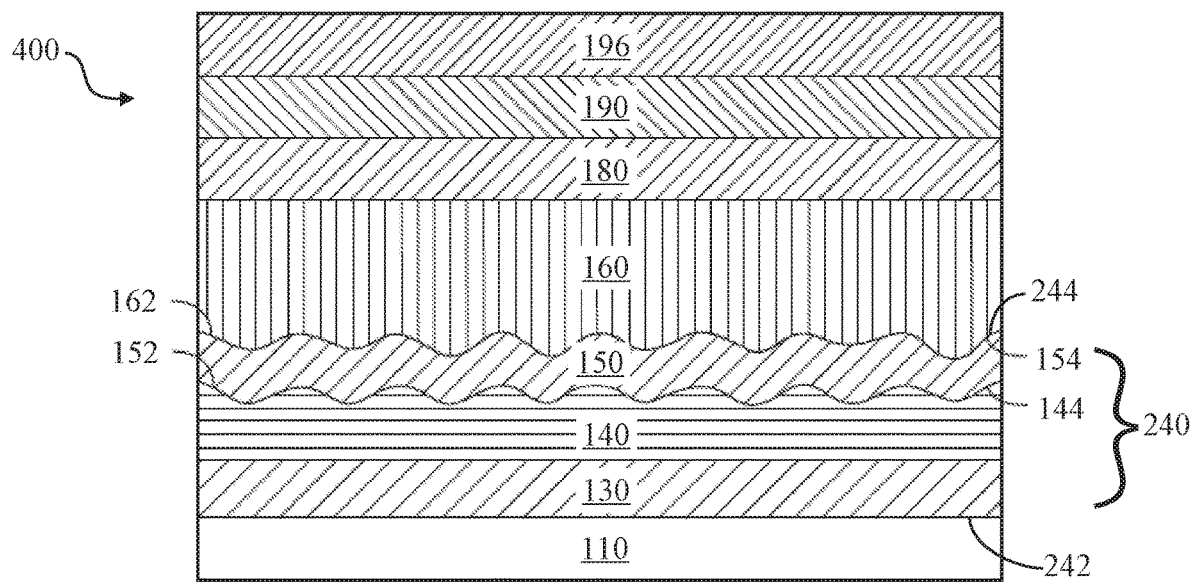
FIG. 6 depicts a different textured topography according to one or more embodiments shown and described herein.
Figure 7:
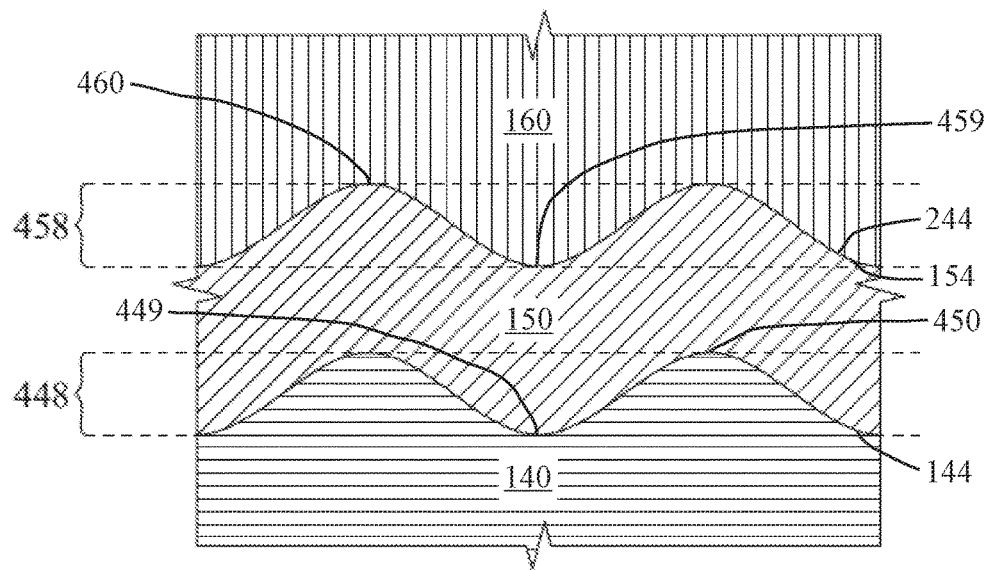
FIG. 7 is an enlarged view of the device of FIG. 7, showing an interfacial transition area according to one or more embodiments shown and described herein.
Figure 8A:
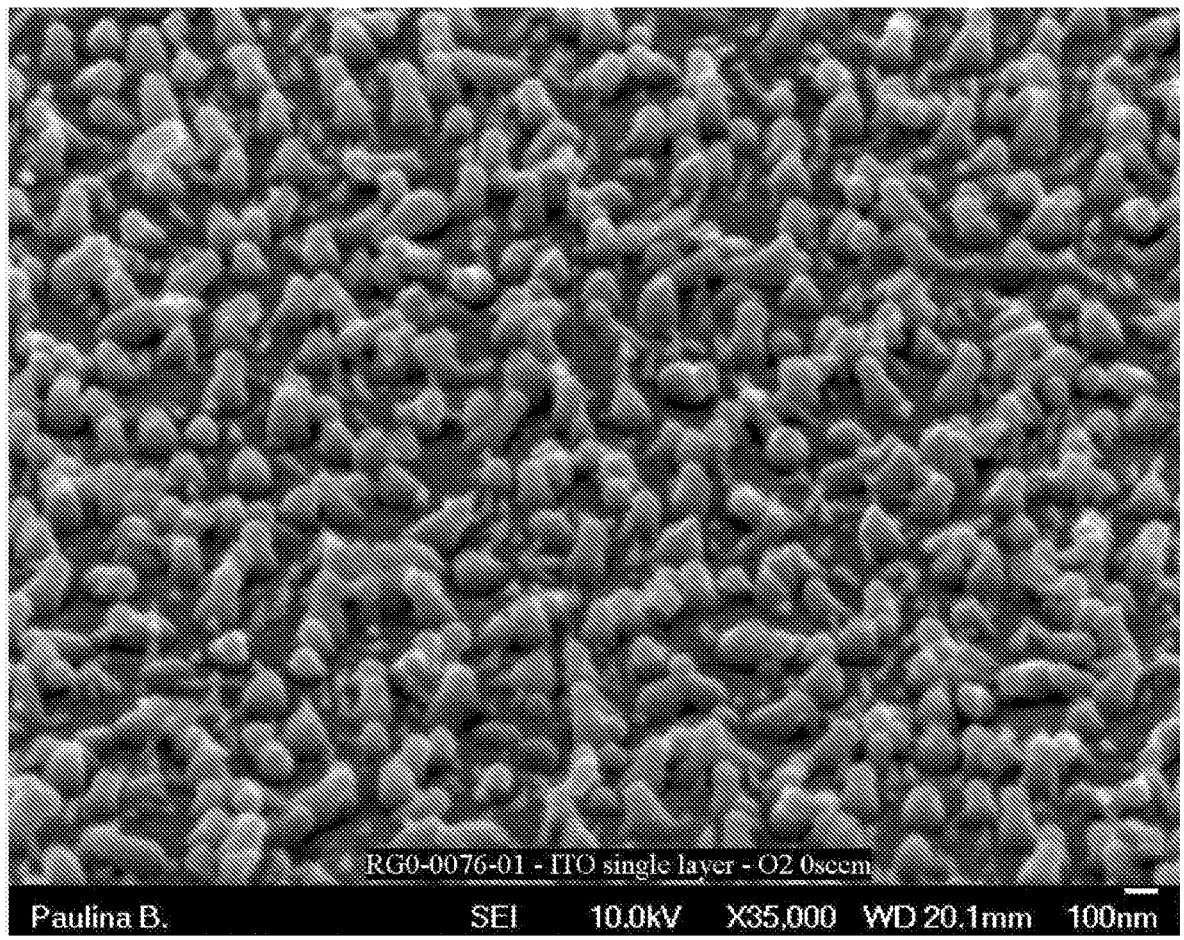
FIGS. 8A, 8B, 8C, and 8D are scanning electron micrographs (SEM) of surfaces of TCO layer stacks having varying textured topographies according to one or more embodiments shown and described herein.
Figure 8B:
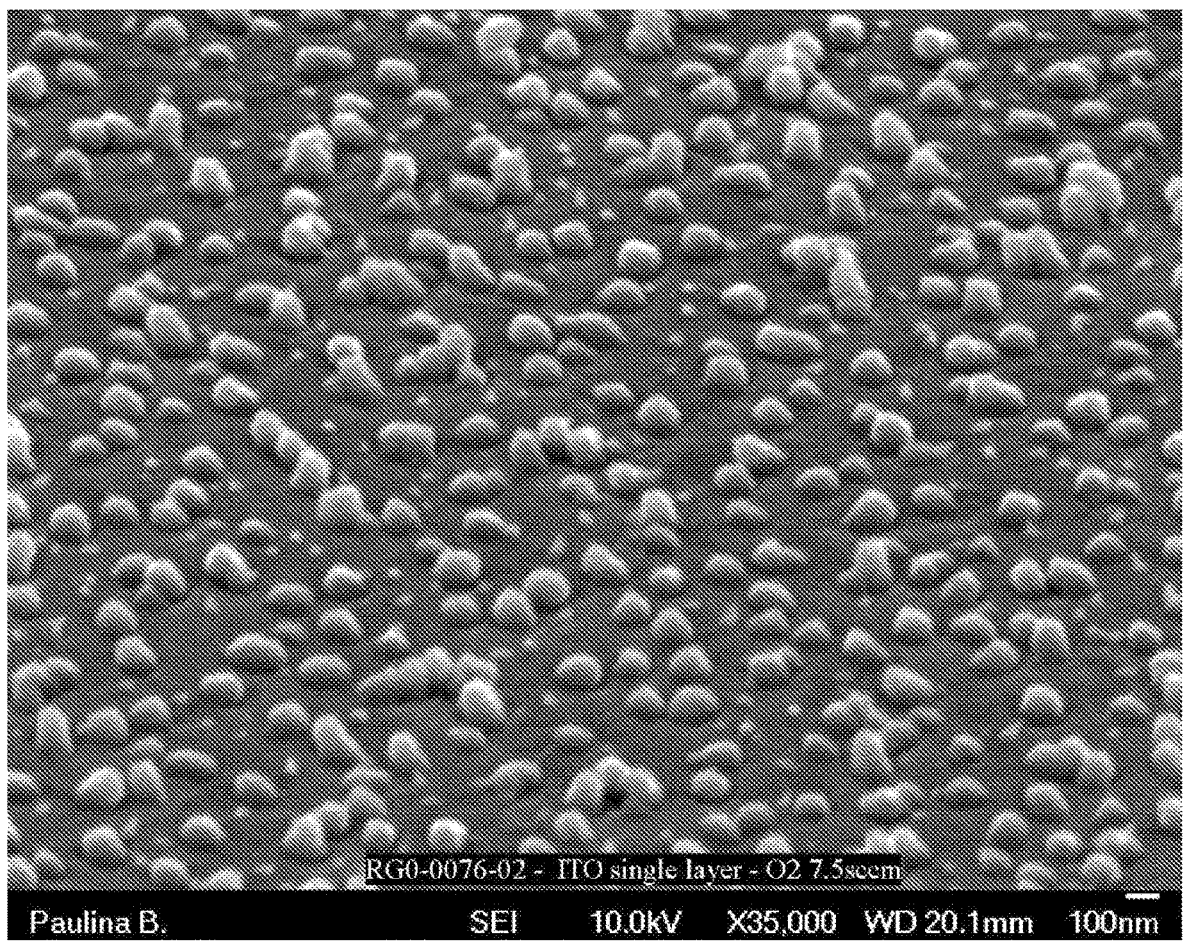
Figure 8C:
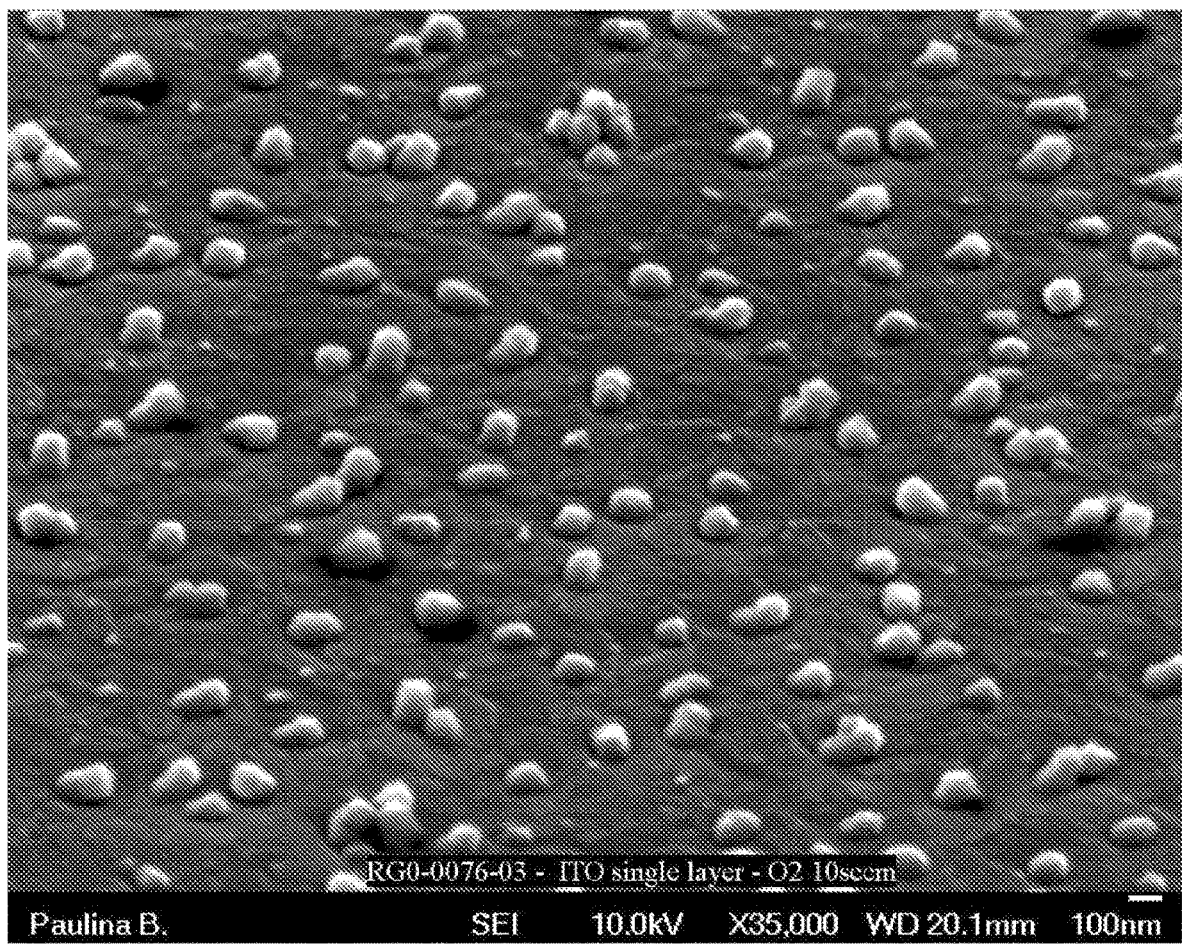
Figure 8D:
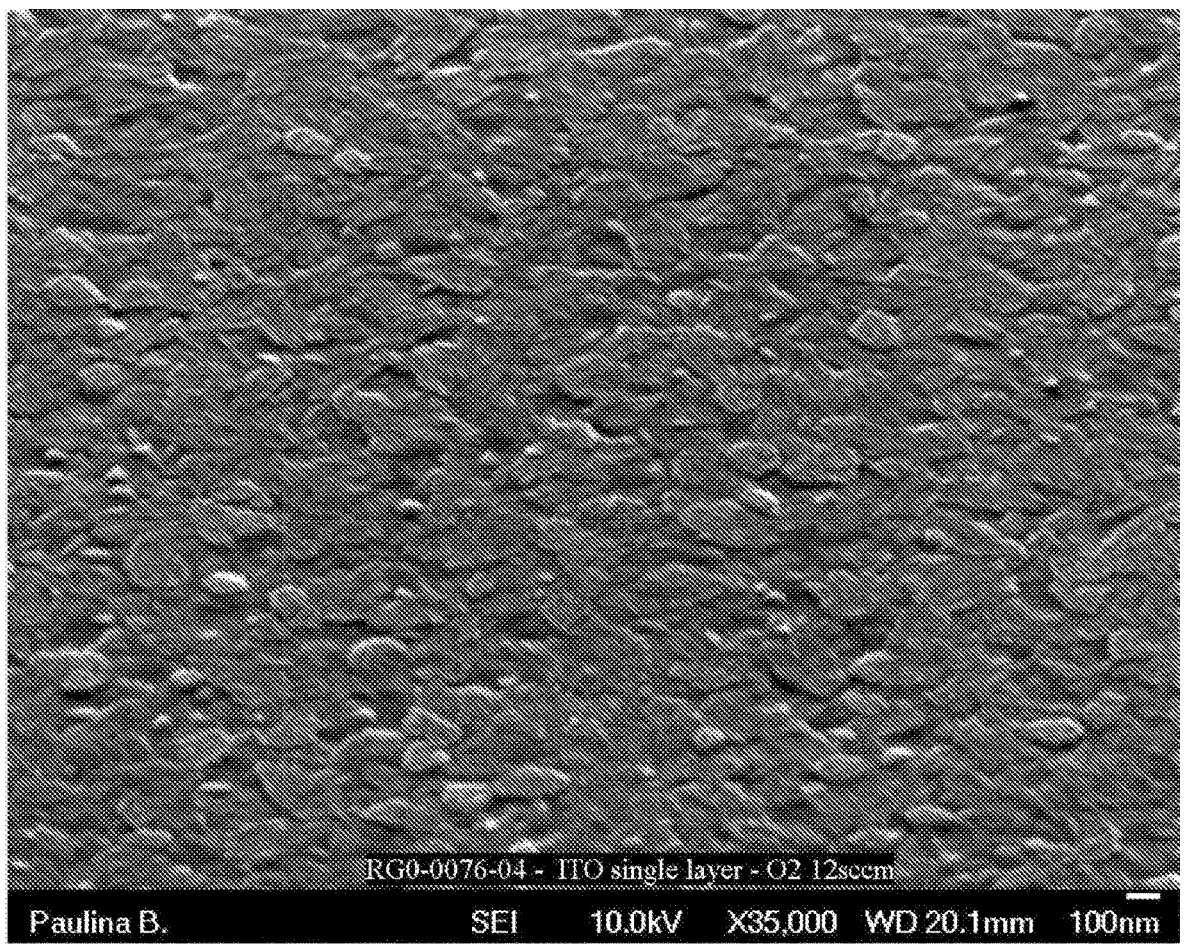

Referring now to FIGS. 6 and 7, another embodiment of a photovoltaic device 400 having a textured topography is shown. The photovoltaic device 400 can be compositionally similar to that the photovoltaic device 100 of FIG. 1, however scribing has been omitted for clarity. Upon substrate 110 are deposited the flowing layers of the TCO layer stack 240 in order: optional barrier layer 130, TCO layer 140, and the buffer layer 150. Then the following layers can be deposited: absorber layer 160, back contact 180, conductor material 190, and back support 196. The photovoltaic device 400 differs from the photovoltaic device 100 of FIG. 1, however, in having a textured topography beginning with the TCO layer/buffer layer interface 144/152, i.e., the interface between the second surface 144 of the TCO layer 140, (the surface away from the energy side of the device) and the first surface 152 of the buffer layer 150. The textured topography is carried over the buffer layer/absorber layer interface 154/162 as well; that interface formed at the second surface 154 of the buffer layer 150 and the first surface 162 of the absorber layer 160. It can be observed that the precise texturing at the buffer layer/absorber layer interface 154/162 can vary from the texture at the TCO layer/buffer layer interface 144/152.

FIG. 7 depicts an enlarged portion of the textured topography region of the photovoltaic device 400. Shown here (bounded by dotted lines for clarity) are two interfacial transition areas 448 and 458. Interfacial transition area 448 is defined by the lowest valley 449 and highest hill 450 of the second surface 144 the TCO layer 140. Similarly, interfacial transition area 458 is defined by the lowest valley 459 and highest hill 460 of the second surface 154 of the buffer layer 150. Consequently, as used herein, an "interfacial transition area" means an intermediate layer where adjacent deposited layers intermingle due to the textured topography hills and valleys of the underlying layer. Within interfacial transition area 448 the semiconductor material of the buffer layer 150 extends into and fills in the valleys of the TCO semiconductor material of the TCO layer 140; and within interfacial transition area 458 the semiconductor material of the absorber layer 160 extends into and fills in the valleys of the semiconductor material of the buffer layer 150. This intermingling of different semiconductor materials provides physical properties within these interfacial transition areas 448, 458 that are hybrids of the individual semiconductor materials within the interfacial transition areas.

One important such physical property is the refractive index, n. It is known from the Fresnel Equations, that reflection of unpolarized light at the interface between two media increases as the difference or "delta" between their respective refractive indices, $n_1$ and $n_2$, increases. Minimizing the refractive index delta at each such interface can reduce the light reflected and increase the light transmitted. For example, in a photovoltaic device 100, 200, 300, 400 like that of FIGS. 1, 3, 6 and 7, a substrate 110 can have a refractive index of about 1.5, e.g., when formed from glass. An absorber layer 160 from a cadmium-based absorber has a refractive index of about 3.0. If a TCO layer 140 has a refractive index of about 1.8 and a buffer layer 150 has a refractive index of about 2.0, then it is possible to create one interfacial transition area between the TCO layer 140 and buffer layer 150 having an effective refractive index of about 1.9; and a second interfacial transition area between the absorber layer 160 and buffer layer 150 having an effective refractive index of about 2.5. Accordingly, each layer interface that includes a textured topography creates an intermediate interfacial transition region that acts as if the device had additional interface. At the same time, the hybrid nature of the interfacial transition areas make the delta in effective refractive index lesser at each step, producing a more gradual gradient in refractive indices. In embodiments with an optional barrier layer 130, the barrier layer 130 composition and/or surface texture may be selected so as to form an additional increment of the gradual gradient refractive index. These features combine to reduce reflection and contribute to more electrical current and power from the device.

By controlling the conditions of sputtering, it is possible to create the textured topography described and shown herein. Conditions known to control the textured topography and the effect each has on average roughness of the topography over ranges tested are shown in Table A, below.

TABLE A

| Condition | Ranges | Effect |
| --- | --- | --- |
| Conditions and Effects on Topography Roughness | | |
| Amount of oxygen flowing into the sputtering chamber | From 0 to about 40 sccm, e.g. 3 to about 20 sccm, or 5 to about 15 sccm | Greater oxygen flow produced smoother sputtering topography |
| Amount of hydrogen flowing into the sputtering chamber | From 0 to about 3% (added to argon carrier); e.g. 1% to 3% or 1% to 2% | Greater hydrogen flow produced rougher sputtering topography; and hydrogen added to oxygen contributed to rougher surfaces. |
| Temperature of substrate | From about 25 to about 400° C.; e.g. from about 200 to about 400° C.; or from about 300 to about 380° C. | As substrate temperature increases, so does roughness |
| Initial roughness of a substrate | From about 0 to about 10 microns; e.g. from about 5 nm to about 2 micron; or from about 20 to about 300 nm. | Glass may be indented or etched to provide an initial roughness; this may be maintained or varied by sputtering conditions. |
| Strength of magnetic field (flux density) | From about 20 to about 100 milli-Teslas (mT); e.g. from about 40 to about 90 mT; or from about 60 to about 80 mT. | As magnetic field strength increases, so does roughness |

Referring again to FIG. 5, a sputtering chamber 60 is shown. A sputtering environment control system 80 is depicted for introducing various gases into the sputter chamber 60. The environment control system 80 can be communicatively coupled to one or more processors 72, which is generally depicted in FIG. 5 as double-arrowed lines. The control system 80 can be programmed with machine readable instructions to automatically adjust the sputtering condition parameters to achieve the desired effect. As a non-limiting example, starting on a smooth substrate, layers of materials may be sputtered with decreasing amounts of oxygen at each layer to enhance the roughness and build the "hills" higher to widen the interfacial transition areas. Alternatively, subsequent layers of materials may be sputtered with increasing amounts of oxygen and/or hydrogen at each layer to smooth the roughness of an initially textured substrate. For greatest roughness effect, the control system can be configured to sputter layers with little or no oxygen or hydrogen supplement and at higher temperatures and/or higher magnetic field strength.

EXAMPLES

Example 1

TCO layer stacks 240 were prepared by sputtering on a glass substrate in an argon environment supplemented with oxygen at varying flow rates as shown in Table B. Oxygen flow is defined by Standard cubic centimeters per minute (sccm). SEM images of the roughness of the resulting TCO layer stacks 240 are shown in FIGS. 8A to 8D. The effect of decreasing roughness with increases oxygen flow can be seen.

TABLE B

TCO layer stacks with varying degrees of roughness

| Device | A | B | C | D |
|---|---|---|---|---|
| Oxygen Flow | 0 sccm | 7.5 sccm | 10 sccm | 12.5 sccm |
| Results FIG. | 8A | 8B | 8C | 8D |

Example 2

Figure 9A:
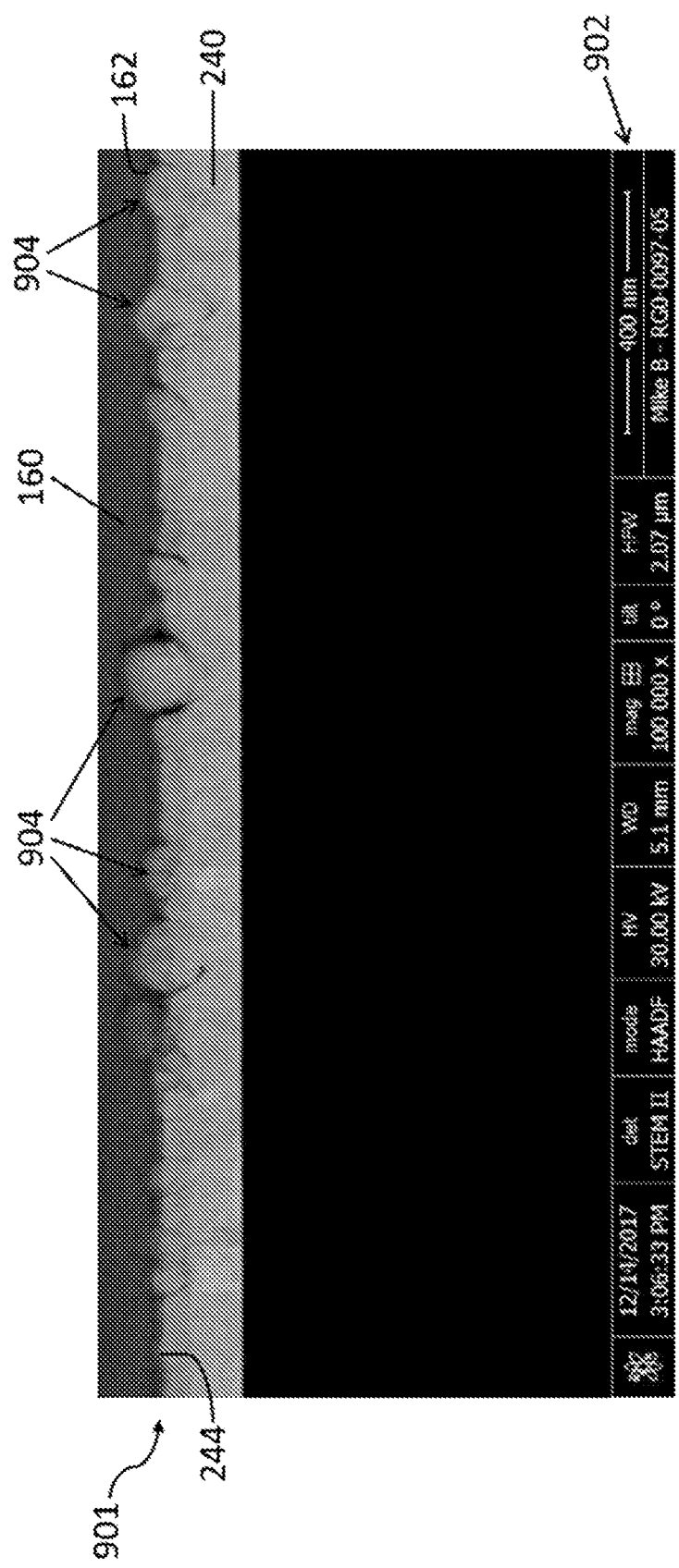
FIGS. 9A, 9B, and 9C are cross-sectional scanning electron micrographs (SEM) of photovoltaic devices having varying textured topographies at an absorber interface according to one or more embodiments shown and described herein.
Figure 9B:
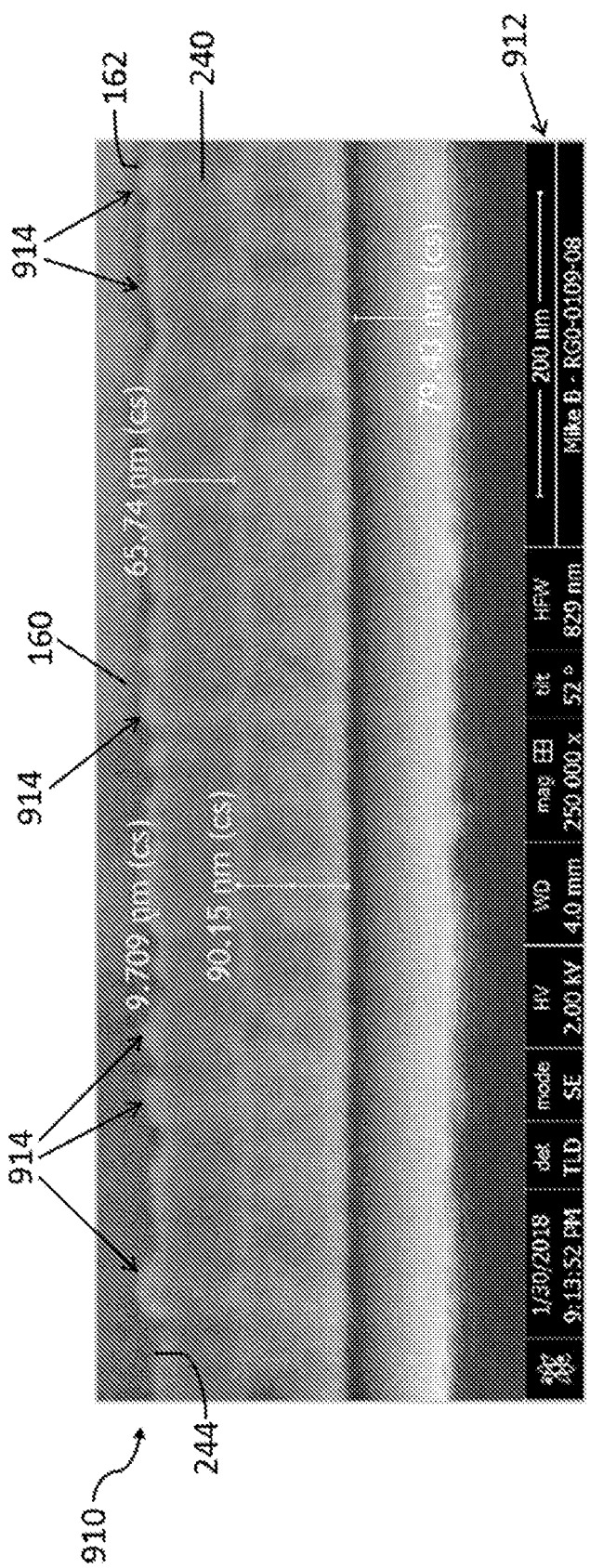
Figure 9C:
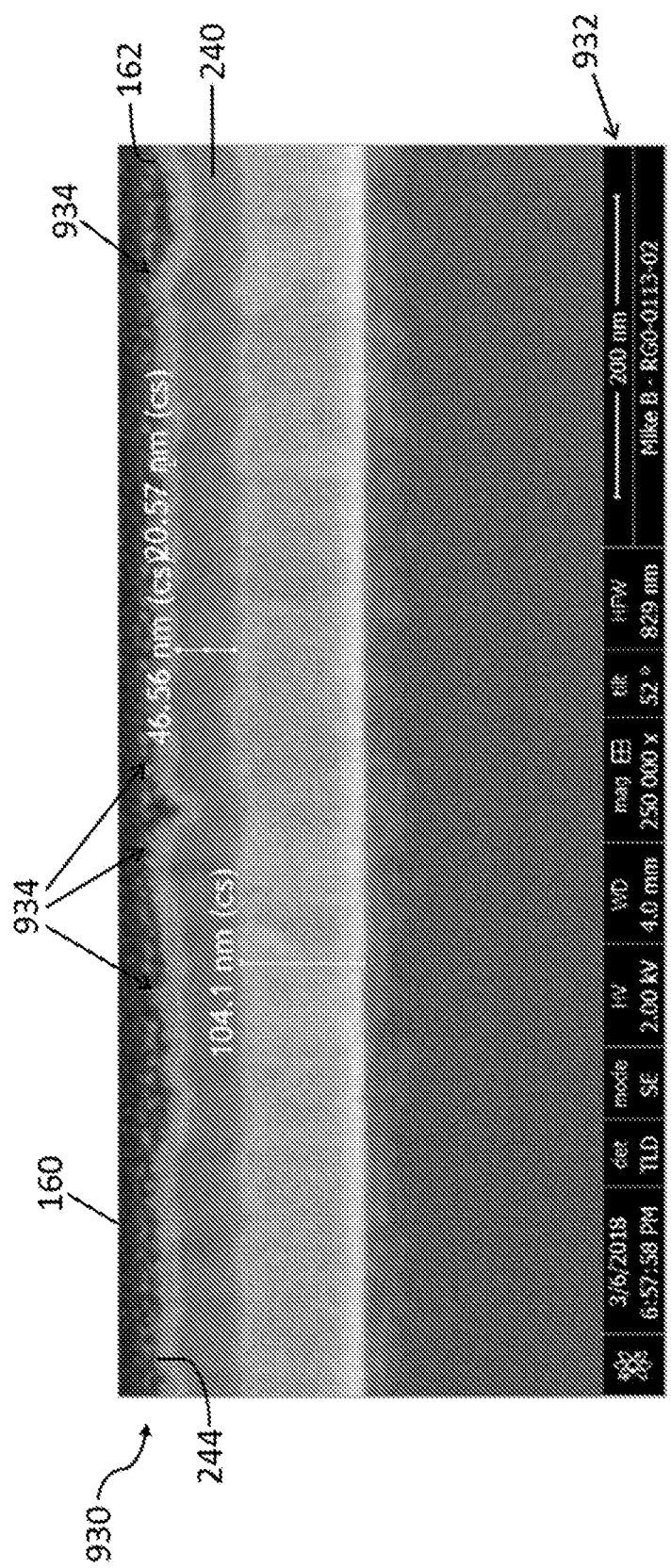

Three photovoltaic devices 901, 910, 930 were prepared by sputtering successive layers as described herein. Roughness was varied by varying the condition of oxygen and hydrogen content of the sputtering environment. Average roughness was determined by ellipsometry. The ellipsometry results are in Table C and cross-sectional SEMs of the devices at the buffer layer/absorber layer interface 154/162 are depicted in FIGS. 9A to 9C. In FIG. 9A, device 901 can be observed based on the scale bar 902, which depicts a 400 nm scale, that some of the larger hills 904, which form grain-like geometry at the interface, at the second surface 244 of the TCO layer stack 240 are more than 100 nm in size. In FIG. 9B, device 910 can be observed based on the scale bar 912, which depicts a 200 nm scale, to have hills 914 having a size at an intermediate level at the second surface 244 of the TCO layer stack 240, with the hills 914 having sizes falling between the size of the hills 904 in device 901 and the hills 934 of the device 930. In FIG. 9C, device 930 can be observed based on the scale bar 932, which depicts a 200 nm scale, with hills 934 at the second surface 244 of the TCO layer stack 240 having the smallest size.

TABLE C

Ellipsometry of PV devices having varying degrees of roughness

| Device | 1 | 2 | 3 |
|---|---|---|---|
| Oxygen Flow | 6 sccm | 15 sccm | 15 sccm |
| Hydrogen concentration (wt % mixed with Ar) | 0% | 2.4% | 0% |
| Roughness by Ellipsometry | 28.8 nm | 11.4 nm | 5.5 nm |
| Results FIG. | 9A | 9B | 9C |

Figure 10:
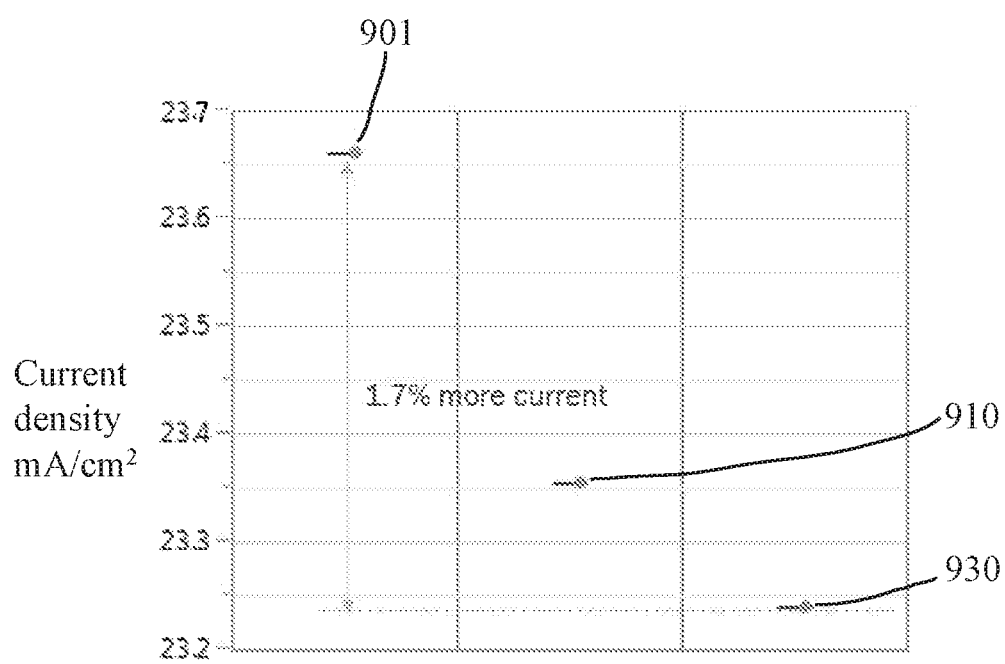
FIG. 10 is a chart showing improvements in current density according to one or more embodiments shown and described herein.

Additionally, these three devices 901, 910, 930 were measured for current density (mA/cm$^2$) by a quantum efficiency measurement system. Compared to device 930 having the second surface 244 of the TCO layer stack 240, which is formed at buffer layer/absorber layer interface 154/162 (See, e.g., FIG. 7), at 5.5 nm has a current density of about 23.24 mA/cm$^2$, device 901 with the roughest second surface 244 of the TCO layer stack 240, i.e., absorber interface, (28.8 nm) had a current flow increase of about 1.7% to about 23.65 mA/cm$^2$, and device 902 with intermediate roughness at the second surface 244 of the TCO layer stack 240 had a current flow increase of about 0.5% to about 23.35 mA/cm$^2$. These data points are plotted in FIG. 10.

According to the embodiments provided herein, a method for manufacturing a photovoltaic device can include sputtering onto a substrate at least one transparent metal oxide layer in an inert sputtering environment. The inert sputtering environment with can be controlled with oxygen at a flow rate of from about 0.1 sccm to about 30 sccm. A sputtered transparent conductive oxide layer stack can be produced having at least one interface with an average roughness greater than about 5 nm. Alternatively or additionally, the transparent conductive oxide layer stack can be annealed.

According to the embodiments provided herein a thin film transparent conductive oxide layer stack can include sputtering onto a substrate at least one transparent metal oxide layer in an inert sputtering environment. The inert sputtering environment can be controlled with oxygen at a flow rate of from about 0.1 sccm to about 30 sccm. A sputtered transparent conductive oxide layer stack can be produced having at least one interface with an average roughness greater than about 5 nm. Alternatively or additionally, the transparent conductive oxide layer stack can be annealed. Alternatively or additionally, the average roughness is from about 5 nm to about 200 nm. Alternatively or additionally, the average roughness is from about 5 nm to about 120 nm. Alternatively or additionally, the average roughness is from about 5 nm to about 60 nm. Alternatively or additionally, the average roughness is from about 5 nm to about 30 nm.

According to another embodiment, a thin film transparent oxide layer stack can include sputtering onto a substrate at least one transparent metal oxide layer in an inert sputtering environment. The inert sputtering environment can be controlled with oxygen at a flow rate of from about 0.1 sccm to about 30 sccm. A sputtered transparent oxide layer stack can be produced having at least one interface with an average roughness greater than about 5 nm. Alternatively or additionally, the transparent conductive oxide layer stack can be annealed.

In a further embodiment, a method for manufacturing an improved thin film transparent oxide layer for use with an associated absorber layer can include sputtering onto a substrate one or more transparent metal oxide layers under conditions selected to produce a sputtered transparent oxide layer having at least one interface having an average roughness when annealed of 5 to 60 nm, said sputtering conditions being selected from (i) supplementing an inert sputtering or annealing environment with oxygen or hydrogen, (ii) increasing the substrate temperature to a range from about 25 to about 400° C., and (iii) increasing a magnetic field strength associated with the sputtering process to a range from about 20 mT to about 100 mT. Upon exposure to incident light, the roughness of the at least one interface of the transparent oxide layer reduces reflection and increases light scattering transmission into the associated absorber layer.

In yet another embodiment, a photovoltaic device can include a substrate a transparent layer stack, and an absorber layer. The transparent conductive layer stack can include at least two transparent metal oxide layers having different refractive indices to form a transparent oxide layer stack in which at least one interface between two metal oxide layers within the transparent conductive oxide layer stack or at least one interface between the transparent conductive oxide layer stack and an adjacent layer has an average roughness of 5 to 60 nm. The absorber layer can be disposed on the transparent layer stack. The roughness of the at least one interface of the transparent oxide layer stack produces an interfacial transition area having an effective refractive index that is intermediate the refractive indices of the two adjacent layers to form a more gradual gradient of refractive indices.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for manufacturing a thin film transparent conductive oxide layer stack for a photovoltaic device, comprising:
    sputtering onto a substrate at least two transparent metal oxide layers in an inert sputtering environment, wherein the substrate comprises glass having a refractive index of about 1.5, and wherein one of the at least two transparent metal oxide layers comprises indium tin oxide (ITO), zinc magnesium oxide (ZMO), tin oxide (TO), or cadmium tin oxide (CTO);
    controlling the inert sputtering environment with oxygen at a flow rate of from about 0.1 sccm to about 30 sccm to produce a sputtered transparent conductive oxide layer stack;
    annealing the transparent conductive oxide layer stack; and
    depositing an absorber layer on the transparent conductive oxide layer stack, the absorber layer comprising a p-type semiconductor material;
    wherein the at least two transparent metal oxide layers define at least three interface regions between the substrate and the absorber layer, at least one of the interface regions having an average roughness greater than 5 nm, and refractive indices of the at least two transparent metal oxide layers are between 1.5 and 3, and the refractive index changes by no more than 0.5 at any of the interface regions; and
    wherein the substrate temperature during sputtering is from about 300° C. to about 400° C.

2. The method according to claim 1 wherein the average roughness is from about 5 nm to about 30 nm.

3. The method according to claim 1 wherein the oxygen flow rate during sputtering is from about 1 sccm to about 20 sccm.

4. The method according to claim 1 wherein the substrate temperature during sputtering is from about 300° C. to about 380° C.

5. The method according to claim 1,
    wherein the at least two transparent metal oxide layers have different refractive indices and at least one of the interface regions between the at least two transparent metal oxide layers within the transparent conductive oxide layer stack or at least one of the interface regions between the transparent conductive oxide layer stack and an adjacent layer has an average roughness of 5 to 60 nm;
    whereby, upon annealing, the roughness of the at least one of the interface regions of the transparent conductive oxide layer stack produces a transition area of effective refractive index that is intermediate to the refractive index of the two adjacent layers to form a more gradual gradient of refractive indices.

6. The method according to claim 1 wherein the absorber layer comprises cadmium telluride having a refractive index of about 3.

7. The method according to claim 6 wherein the at least two of the metal oxide layers are selected from indium tin oxide (ITO), zinc magnesium oxide (ZMO), tin oxide (TO), and cadmium tin oxide (CTO).

8. The method according to claim 6 wherein the average roughness is from about 5 nm to about 30 nm.

9. The method according to claim 1 wherein the substrate has an initial roughness of 5 nm to 2 μm.

10. A method for manufacturing an improved thin film transparent conductive oxide layer for use with an associated absorber layer, the method comprising:
    sputtering onto a substrate one or more transparent metal oxide layers under conditions selected to produce a sputtered transparent conductive oxide layer having at least one interface having an average roughness when annealed of 5 to 60 nm, said sputtering conditions being selected from (i) supplementing an inert sputtering or annealing environment with at least one of oxygen and hydrogen, (ii) increasing the substrate temperature to a range from about 300 to about 400° C., and (iii) increasing a magnetic field strength associated with the sputtering process to a range from about 20 mT to about 100 mT;
    whereby, upon exposure to incident light, the roughness of the at least one interface of the transparent conductive oxide layer reduces reflection and increases light scattering transmission into the associated absorber layer.

11. The method according to claim 10 wherein the average roughness is from about 5 nm to about 30 nm.

12. The method according to claim 10 wherein the sputtering is done under a condition of supplementing with oxygen at a flow rate from about 0.1 sccm to about 30 sccm.

13. The method according to claim 12 wherein the sputtering is done under a condition of supplementing with oxygen at a flow rate from about 1 sccm to about 20 sccm.

14. The method according to claim 12 wherein the sputtering is done under a further condition of supplementing with hydrogen at up to 3% by weight of the inert environment.

15. The method according to claim 10 wherein the sputtering is done under a condition of substrate temperature from about 300 to about 380° C.

16. The method according to claim 10 wherein the sputtering is done under a condition of magnetic field strength from about 40 to about 90 mT.

17. The method according to claim 1, further comprising a step of sputtering a third transparent metal oxide layer and wherein the at least two transparent metal oxide layers and the third transparent metal oxide layer define at least four interface regions between the substrate and the absorber layer.

* * * * *